United States Patent [19]

Dietze et al.

[11] 4,035,460

[45] July 12, 1977

[54] SHAPED BODIES AND PRODUCTION OF SEMICONDUCTOR MATERIAL

[75] Inventors: Wolfgang Dietze, Munich; Andreas Kasper, Garching-Hochbrueck; Ulrich Rucha, Munich, all of Germany

[73] Assignee: Siemens Aktiengesellschaft, Berlin & Munich, Germany

[21] Appl. No.: 579,607

[22] Filed: May 21, 1975

Related U.S. Application Data

[63] Continuation of Ser. No. 356,056, April 30, 1973, abandoned.

[30] Foreign Application Priority Data

May 16, 1972 Germany .......................... 2223868

[51] Int. Cl.² ...................... B01J 17/30; B01J 17/32
[52] U.S. Cl. ................................ 264/81; 264/317; 264/327
[58] Field of Search ............ 264/81, 40, 40.1, 40.6, 264/317, 327; 427/248 R

[56] References Cited

U.S. PATENT DOCUMENTS

| 3,747,559 | 7/1973 | Dietze | 264/81 |
| 3,751,539 | 8/1973 | Reuschel | 264/81 |

*Primary Examiner*—Thomas P. Pavelko
*Attorney, Agent, or Firm*—Hill, Gross, Simpson, Van Santen, Steadman, Chiara & Simpson

[57] ABSTRACT

A technique for producing one or more shaped bodies of semiconductor material using the steps of depositing a layer of the semiconductor material from the gas phase onto the outer surface of a heated, hollow carrier body, or onto the mutually remote surfaces of two carrier bodies spaced from one another, and thereafter removing the carrier body or bodies from the layer or layers so formed. Each carrier body is heated indirectly by a heater body located within said hollow carrier body, or between said spaced carrier bodies, and heated to a temperature above the deposition temperature of the semiconductor material.

3 Claims, 8 Drawing Figures

SHAPED BODIES AND PRODUCTION OF SEMICONDUCTOR MATERIAL

This is a continuation, of application Ser. No. 356,056, filed Apr. 30, 1973, now abandoned.

BACKGROUND OF THE INVENTION

The art has heretofore known generally that shaped semiconductor bodies can be made by depositing a semiconductor material onto a heated carrier body at elevated temperatures in an appropriate atmosphere; see, for examples, Brit. Pat. No. 1,263,580 and W. Ger. Pat. No. 1,805,970.

The carrier body is heated to semiconductor deposition temperature either inductively or by the direct passage therethrough of an electric current.

In this way silicon tubes of the type useful in diffusion processes can be produced using silico-chloroform as the starting compound and temperatures from about 1050° to 1250° C. in a hydrogen atmosphere. The silicon tubes so produced have the advantage of a high degree of purity. The carrier body used for making such a silicon tube advantageously is made of graphite and is in a hollow form. This body, following such a deposition process, is then conveniently burned away by heating in an atmosphere containing oxygen.

In such a diffusion deposition process (see above-mentioned Brit. patent specification No. 1,263,580), the carrier body has been heated either by means of multi-turn induction heating coil which surrounds the deposition chamber, or, if the carrier body is of tubular shape, by means of a current conductor arranged in the interior of the carrier body, which conductor is connected in such a way that the carrier body is directly heated by an electric current.

The direct heating of graphite carrier bodies by a current has been found to have the significant disadvantage that the current is commonly not uniformly distributed over the cross-sectional area of the graphite body, and consequently the temperature distribution over the deposition surface is non-uniform. Such semiconductor material deposition conditions leads to products of variable quality and of uncertain characteristics, while the production of semiconductor shaped bodies using directly heated carrier bodies which are of a complicated shape either cannot be carried out at all, or, at best, is so extremely expensive as to be commercially impractical. Furthermore, such a deposition procedure makes it difficult to produce semiconductor bodies of substantially uniform characteristics having a predetermined wall thickness.

In addition, such a direct carrier body heating technique commonly involves deposition of semiconductor material on the heater body (or heater element) commonly necessitating intermediate processing, and, typically, clean-up of such heater bodies before re-use. Indeed, sometimes the heater body itself may be used only once in some prior art embodiments.

Sometimes the heater body cannot be separated from the carrier body, or is at best only difficultly separable, which is a further problem in the prior art.

Moreover, such prior art heating technique in semiconductor deposition does not enable one to produce controlled temperature variations in the carrier body during deposition of semiconductor material thereon, such as is especially desired sometimes when making shaped bodies of semiconductor material having particular, non-uniform, cross-sectional configurations, including bodies with slots and holes.

BRIEF SUMMARY OF THE INVENTION

The present invention is believed to overcome the disadvantages of the prior art technology and relates to an improved method and apparatus for making shaped bodies of semiconductor material, especially of silicon, and this invention has a primary objective the provision of such a technique.

Another objective is to provide such an improved technique wherein product semiconductor shaped bodies of high quality and high uniformity are prepared.

Another objective is to provide such semiconductor bodies by the substantially completely uniform deposition of semiconductor material onto a heated carrier body which carrier body following such a deposition may be substantially completely removed by oxidation thereof if desired.

Another objective is to provide an improved method and apparatus for making shaped bodies of semiconductors involving deposition of a semiconductor material such as silicon onto a heated carrier substrate body where the improvement relates to the manner in which the carrier substrate is heated and positioned during such deposition in an appropriate environment.

Another objective is to provide a technique for making shaped, semiconductor bodies of substantially uniform characteristics having predetermined wall thickness which may, if desired, be varied and controlled through regulation of heating conditions and equipment employed during formation of such bodies.

Another objective is to provide a technique for making shaped, semiconductor bodies wherein the heater body used to heat the carrier substrate body used for semiconductor deposition during diffusion is maintainable substantially free from semiconductor material.

Another objective is to provide techniques for heating and positioning carrier bodies during deposition thereon by diffusion of semiconductor material, especially silicon.

Another objective is to provide such techniques as just indicated wherein shaped semiconductor bodies so produced are very easily removed from carrier bodies, and the carrier bodies from heater bodies.

Other and further objects will be apparent to those skilled in the art from a reading of the present specification, drawings and claims.

DETAILED DESCRIPTION

Figure 1:
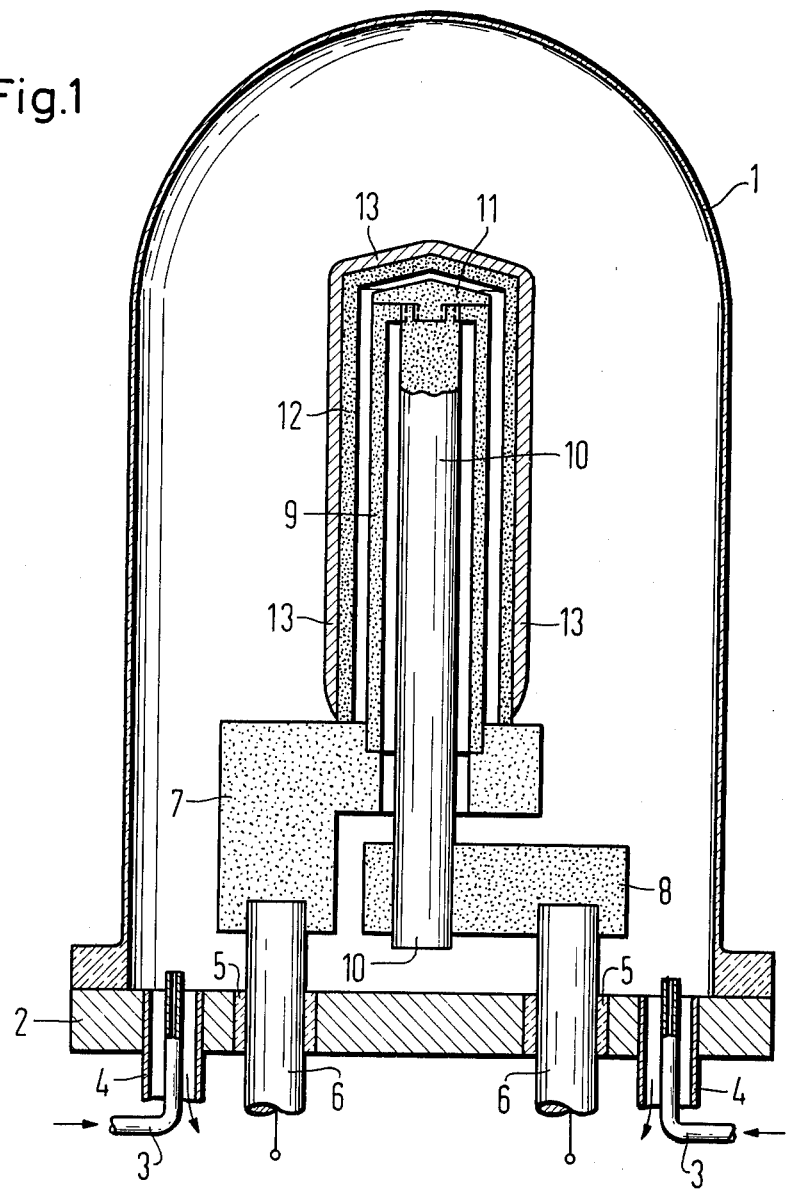
FIG. 1 is a vertical sectional view of first form of apparatus suitable for the practice of the present invention.

The apparatus shown in FIG. 1 comprises a bell-shaped reaction vessel 1 whose mouth incorporates a single heater arrangement which is adapted for the production of individual silicon tubes. The apparatus makes a gas-tight seal with a baseplate 2. The baseplate 2 contains gas outlet passages 4 through which pass gas inlet passages 3. The baseplate 2 also contains insulating ducts 5 through which a pair of current supply leads or electrodes 6 are conducted into the interior of the reaction vessel 1. The ducts 5 are conveniently made of tetrafluoroethylene, or the like, and the current supply leads 6 are made of silver, or the like, though any convenient materials may be employed.

At the end of the current supply leads 6, within the vessel 1, is positioned a couple of holders 7 and 8, respectively, which are here conveniently made of graphite. Holder 7 supports the lower end of a vertically positioned hollow tube 9 which is conveniently formed of graphite and which is used as a heater tube, while holder 8 is connected to the lower end of a solid, vertically positioned, cylindrical rod 10 which is conveniently formed of graphite. Tube 9 and rod 10 are generally coaxial with adjacent side walls uniformly radially spaced from one another. A plate 11 which is conveniently formed of graphite electrically interconnects tube 9 with tube 10 at their respective upper ends, the interconnection being made by any convenient means, such as by mating screw threads between outer walls of a downwardly extending flange on plate 11 and opposed inner, upper end walls of tube 9. The entire heater body arrangement comprising tube 9, rod 10 and plate 11 is enclosed within a hollow vertically positioned cylindrical carrier body 12 which is conveniently formed of graphite, is closed at its upper end and open at its lower end, and serves as a carrier body or substrate for the deposition of the semiconductor material thereonto. Body 12 is generally coaxial with tube 9 and adjacent surfaces of tube 9 and plate 11 are uniformly spaced from inner walls of body 12.

When a voltage is applied across the electrodes 6, the heater body comprising tube 9, plate 11 and rod 10 is heated directly by passage of current therethrough. The radiation of heat therefrom then results in the indirect heating of the carrier body 12, so that a vaporizable compound of a semiconductor (not shown) which is introduced into the reaction vessel 1 in a gas phase preferable in a mixture with a carrier gas through the inlets 3, decomposes on contact with body 12 and forms a layer 13 of semiconductor material is deposited on the exterior, exposed surfaces of the carrier body 12. The carrier gas may be reactive with the semiconduction compound gas under conditions maintained in the reaction vessel.

This arrangement provides a substantially uniform deposition of semiconductor material in layered form upon a carrier body and the heater body remains substantially completely free from deposited semiconductor material and can thus be re-used again immediately and repeatedly. Also, in this arrangement, the semiconductor bodies produced therewith by deposition can be very easily removed from the carrier bodies subsequently, particularly when making silicon tubes. In addition, with this arrangement, a carrier body is not subjected to an excessive weight load, owing to the structure of the holder assembly (including heater body and carrier body). Further, carrier body is easily separated from heater body.

Figure 2:
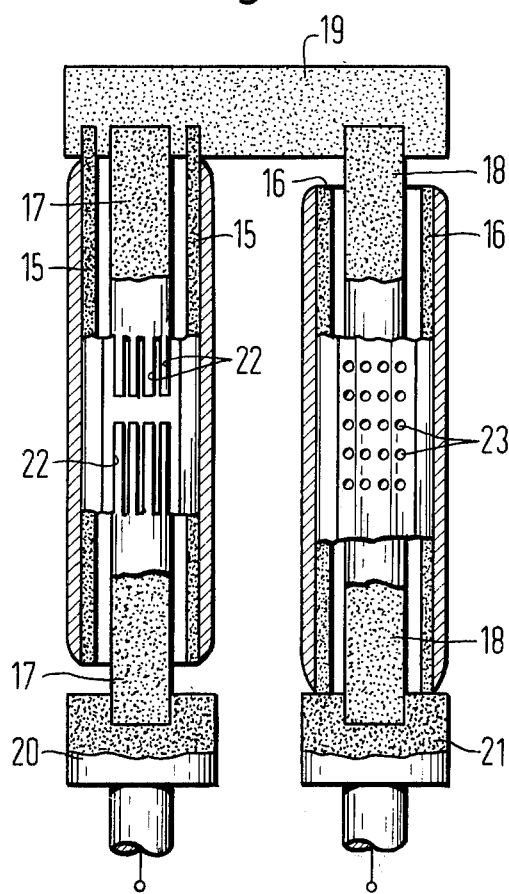
FIG. 2 is a vertical sectional view similar to FIG. 1, but showing only the carrier and heater body combination of a second form of apparatus suitable for the practice of the present invention.

FIG. 2 illustrates a multiple heater arrangement which is adapted for the simultaneous production of a plurality of silicon tubes, each of which is here provided with recesses. In the embodiment shown, which is used for two tube production, the interior of each of the two tubular carrier bodies 15 and 16 is fitted with a solid rod 17 and 18, respectively. Each rod 17 and 18 functions as an individual heater body. Rods 17 and 18 are electrically interconnected to one another at their upper ends by a plate 19, which is conveniently formed of graphite. The heating of the rods 17 and 18 is effected via holders 20 and 21, which are each conveniently formed of graphite, and which support the lower respective ends of each rod 17 and 18. In the arrangement illustrated, the carrier body 15 is provided with axially extending, circumferentially located slots 22 in its surface, while the carrier body 16 is similarly provided with holes 23. In this way, silicon tube products can be produced by this invention which are similarly so sloted or perforated and which have utility in accomodating diffusion wafers, as those skilled in the art will appreciate. Similarly to the case of the FIG. 1 embodiments, the vertically positioned elements in an individual assembly of heater body and carrier body elements are generally coaxial as respects each other with adjacent side walls being uniformly spaced radially. Carrier body 15 is suspended from plate 19 which carrier body 16 is supported by holders 21. By adjusting the lengths of cylindrical rods 17 and 18 relative to tubular carrier bodies 15 and 16, respectively, exposure of rods 17 and 18 to vapors of semiconductor material during deposition may be minimized if desired, so that the heater body may be re-used immediately and repeatedly after usage.

Figure 4:
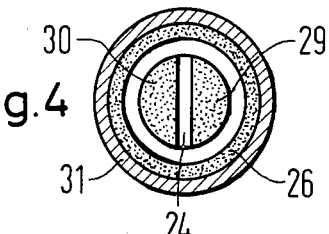
FIG. 4 is a horizontal sectional view taken along the line IV—IV of FIG. 3.
Figure 3:
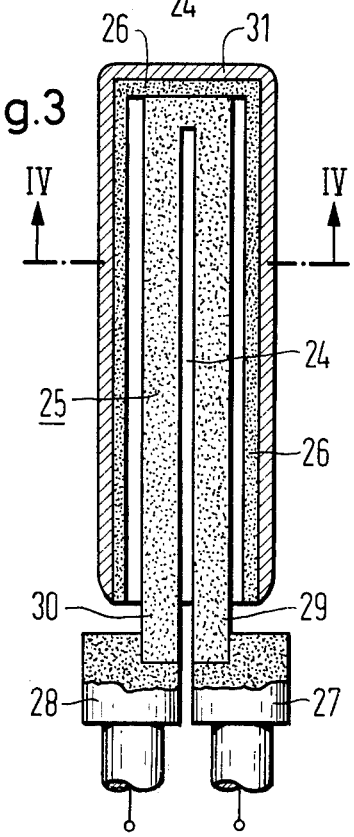
FIG. 3 is a vertical sectional view similar to FIG. 1, but showing only the carrier and heater body combination of a third form of apparatus suitable for the practice of the present invention.

FIGS. 3 and 4 illustrate a heater and carrier arrangement similar to that shown in FIG. 1 but utilizing a single-piece type of heater body construction in which a vertically mounted, cylindrical heater body rod 25 conveniently formed of graphite has a blind axial slot 24 longitudinally upwardly extending from its lower end. Rod 25 supports, at its closed upper end, a carrier body 26 conveniently formed of graphite which surrounds rod 25 and has its inside walls generally uniformly spaced from the outside walls of rod 25. Rod 25 is heated through the holders 27 and 28 which are connected to the two flanks 29 and 30 respectively, at the lower end of rod 25. The deposition of a semiconductor material layer 31 on the exterior surfaces of carrier 26 proceeds similarly to that associated with the FIG. 1 arrangement.

Figure 5:
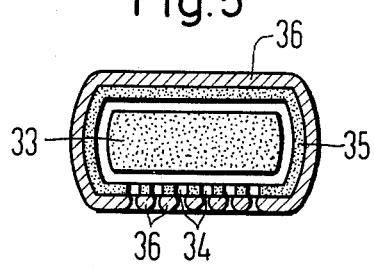
FIGS. 5 to 8 are views each of a type similar to that of FIG. 4, but showing various carrier and heater body arrangements adapted for use in practicing the present invention.

FIG. 5 illustrates in cross-section an embodiment of a heater and carrier arrangement similar to that shown in FIG. 1 but utilizing a carrier body 35 conveniently formed of graphite and which has spaced, parallel flattened side walls, one of such walls being equipped with slots 34. This arrangement employs a heater body assembly 33 with a carrier body 35 uniformly spaced from the inside walls thereof. During deposition of a semiconductor material, such as silicon, on a carrier body 35 to form a shaped body 36 on carrier body 75, rib portions are produced in body 36 between the slots 34 of body 35.

Figure 6:
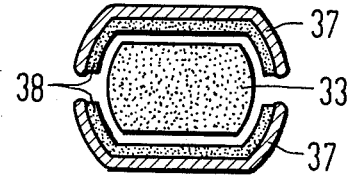

FIG. 6 illustrates in cross-section an embodiment of a heater and carrier arrangement similar to that shown in FIG. 1, but utilizing a longitudinally slotted carrier body 38 which is conveniently formed of graphite and mounted over a heater body assembly 38. During deposition of a semiconductor material, like silicon on a carrier body 38, a pair of boat-like shaped bodies 37 are formed.

Figure 7:
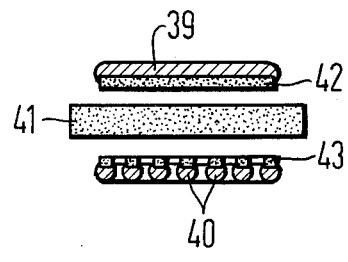

FIG. 7 illustrates in cross-section an embodiment of a heater and carrier arrangement similar to that shown in FIG. 1 but utilizing a flattened, plate-like heater body assembly 41 within a U-shaped carrier body conveniently formed of graphite and mounted thereover so as to have spaced, parallel side walls 42 and 43 positioned in uniformly spaced relationship to the broad faces of heater body assembly 41. Wall 43 is slotted. During deposition of simiconductor material, such as silicon, on outside faces of respective walls 42 and 43, a solid plate like shaped semiconductor body 39 is formed on wall 42, while a perforated plate-like shaped semiconductor body 40 is formed on wall 43.

Figure 8:
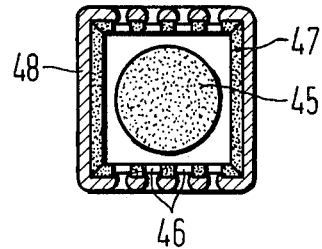

FIG. 8 illustrates a cross-section an embodiment of a heater and carrier arrangement similar to that shown in FIG. 1 but utilizing a cross-sectionally circular heater body assembly 45 within a cross-sectionally square carrier body 47, conveniently formed of graphite, one pair of opposed faces of such body 47 bearing slots 46. During deposition of a semiconductor material such as silicon on exposed faces of such body 47, a cross-sectionally square shaped semiconductor body 48 is formed which is slotted in one pair of opposed side walls as shown.

FIGS. 5 to 8 illustrate, among other things that, as a result of the indirect heating of carrier bodies, any desired form of shaped semiconductor body can be produced by the teachings of this invention. The indirect heating provided by a heater body makes it possible to adapt directly the shape of such heater body to the shape of a carrier body, or vice versa. These FIGS. 5 to 8 further demonstrate that predetermined temperature variations may be provided in an indirectly heated carrier body by varying the distance between such a body and a heater body associated therewith.

Shaped, semiconductor bodies produced by the teachings of the present invention are used in the production of semiconductor components. However, such bodies can also be produced by these teachings which are suitable for use in the chemical field, all as those skilled in the art will readily appreciate.

The apparatus adapted for the preparation of shaped, semiconductor bodies thus comprises a gas-tight reaction vessel, a heater assembly means, a carrier body means, a first source of gaseous compound a second source of gaseous compound, and preferably a pressure regulation means. The vessel, heat assembly means and carrier body means are as described above. The pressure regulation means is typically a conventional vacuum pump assembly as those skilled in the art will readily appreciate. Such a means is functionally associated with the outlet port means of the reaction vessel and is adapted to maintain the gaseous interior of the reaction vessel at a predetermined pressure. Preferably, the processes of the present invention are carried out at atmospheric pressures so that the pressure regulation means need not be employed to generate atmospheres other than atmospheric.

The first source of gaseous compound can be any convenient and conventional means which will release, as through a tube interconnecting with the inlet port of the reaction vessel, a gaseous compound as indicated above, such a compound is one which will produce a predetermined semiconductor material by thermal decomposition from gas phase at elevated temperatures which are below the melting point of this compound. Such semiconductor material once so generated is thus adapted to diffuse and deposit upon outside surfaces of the carrier body means.

The second source of gas can likewise be any convenient and conventional means, such as a cylinder of compressed gas or the like. This gas is chosen so as to be either inert as respects the gaseous compound from the first source, as when such compound is thermally decomposable by itself, or is reactive with the gaseous compound from the first source. In the practice of the process of this invention, the gas from this second source is reactive with the gas from the first source, the reactivity being such that there is produced a pure silicon or other semiconductor material for deposition onto a desired substrate. From the second source of gas, the reactive gas is adapted to react with said compound of semiconductor material at the predetermined temperature of the surface of the carrier body to produce a desired semiconductor material.

In apparatus of this invention, the interrelationship between a heater assembly means and an associated carrier body means in a given apparatus embodiment is such that outside surfaces of each carrier body means, as opposed to the inside surfaces thereof, which are adjacent the heater, assemble means, are adapted to be heated by the heater assembly means in a predetermined profile relative thereto to produce predetermined temperatures on respective outside surface portions thereof which are typically lower than said predetermined temperatures of the heater assembly means by at least about 200° C.

Control of temperature conditions existing on the surface of the carrier bodies in equipment operation is facilitated by using a space gap between side walls of a heating element and adjacent side walls of a carrier body, the exact gap in any given situation being dependent upon desired temperatures on the exposed surface regions of a carrier body, semiconductive materials involved, carrier body configurations, and the like. Carrier bodies and associated heater bodies preferably have, through respective side wall regions, cross-sectionally circular configurations for ease in handling and operation. Graphite of high purity is a preferred material of conduction for carrier bodies and heater bodies particularly since metal contamination is thereby avoided in shaped simiconductor bodies made by the teachings of this invention. Preferably also, an individual heater assembly is substantially completely enveloped by a carrier body.

In the practice of the present invention using apparatus such as above described to deposit semiconductor material upon a carrier substrate body, one first positions a carrier substrate body adjacent a heat source. The carrier substrate body is formed of graphite and has spaced, parallel side wall portions with the portions of one side wall facing said heat source. The heat source is adapted when heated to radiate thermal energy in a controlled, predetermined manner. This positioning of carrier body relative to heat source is such that portions of the other, (outer) side wall of said carrier substrate body are heatable in a controlled, predetermined profile relative to such outer side. In addition, the temperatures of said heat source are at least about 200° C. higher than the maximum temperature of deposition for the particular semiconductor material being deposited on said carrier substrate body when heating said carrier substrate body by said heat source.

Then, one heats by using such heat source in an inert, gaseous environment, such outer portions of said carrier substrate body to a temperature which is at least equal to the decomposition point of a thermally decomposable gaseous compound of a semiconductor material which compound thermally decomposes to produce the desired semiconductor material. This temperature is, however, below the vaporization point of such semiconductor material itself.

The so-heated said outer portions are contacted with said gaseous compound in said inert gaseous environment under appropriate conditions at a concentration and for a time sufficient to cause deposition upon said outer portions of a layer of said semiconductor material of desired thickness.

The heating is conducted in the presence of a gaseous environment which is conveniently and preferably maintained at about atmospheric pressures (e.g., 760 mm Hg abs.). Silicon is a preferred semiconductor material for purposes of practicing the process of this invention, and a preferred gaseous compound thereof is silicochloroform (or trichlorosilone) which is deposited in the presence of hydrogen as a reactive gas. Other suitable silicon compounds include dichlorosilone ($Si H_2 Cl_2$), and tetrachlorosilone ($Si Cl_4$) which are each used with hydrogen, and silone ($Si H_4$). In addition to hydrogen, an inert gas may be present, if desired. Preferred temperatures on the outside wall portions of a carrier body at the time of deposition of silicon thereon in making a shaped semiconductor body range from about 1050° to 1250° C. while corresponding temperatures associated with the heat source are at least about 1400° C. with the temperature of such heat source always being at least about 200° C. above the temperature used for deposition of the semiconductor material on a carrier body's exposed outside surface portions undergoing deposition to produce a shaped semiconductor body.

Preferably, the heat source used in a given process has an exterior surface configuration approximating the surface configuration of side wall portions of the carrier substrate body adjacent thereto, and preferably the inside wall portions of the carrier substrate body facing the heat source are spaced therefrom by a substantially uniform gap. Heating may be, and preferably is, commenced before contacting the carrier body with the decomposable gas of semiconductor compound, but such heating and contacting may be commenced simultaneously. A process may be practiced continuously or batch-wise using one or, simultaneously, a plurality of carrier substrate bodies (two such bodies being one preferred practice) and/or, simultaneously, a plurality of heat sources (two such sources being one preferred practice). Heating is practiced by directly applying an electric current to a suitably designed heat source(s).

In an especially preferred form of the process of this invention, the inert gas comprises hydrogen, the thermally decomposable gaseous compound comprises trichlorosilone ($Si H Cl_3$), and the temperature of said outer portions of said carrier substrate body ranges from about 1150° to 1200° C., and the temperature of said heat source or heater is at least about 200° C. higher than said temperature of said outer portions.

After deposition of a semiconductor material, such as silicon, on a carrier body, as described, the carrier body (graphite) may be removed by simple oxidation. One convenient and preferred procedure involves exposing the combination of carrrier body with silicon deposited thereon to a temperature in the range of from about 500° to 1000° C. in atmospheric air for a time sufficient to combust substantially completely the graphite carrier substrate body and thereby produce a shaped semiconductor body of silicon. The thus produced semiconductor body characteristically has a smooth surface, a dense, non-porous structure, and high mechanical and thermal stability or integrity.

EMBODIMENT

The present invention is further illustrated by reference to the following Example. Those skilled in the art will appreciate that other and further embodiments are obvious and within the spirit and scope of this invention from the teachings of the present Example taken with the accompanying specification and drawings. All parts are parts by weight, unles others were indicated.

EXAMPLE 1

In apparatus of the type as shown and described above in FIG. 1, a graphite carrier body in the form of a capped cylinder of graphite is mounted over a graphite heater body.

The reaction chamber is maintained at atmospheric pressure and is sealed. The heater body is heated with direct current. The exterior, circumferential outside surfaces of the carrier body have a temperature of from about 1150° to 1200° C. while the temperature of the adjacent surfaces of the heater body have a temperature of about 1400° C.

A continuous gas current through the reaction chamber is maintained and a gas stream comprising a mixture of silicochloroform and hydrogen is charged at the rate of about 5 liters per hour per square centimeter of depositing surface to the reaction chamber. This mixture contains about one part $Si H Cl_3$ and lo parts $H_2$. Silicon deposits on the carrier body and hydrogen chloride ($H Cl$) is formed, which, in balance with the $Si H Cl_3$ and the $H_2$ influences the rate of silicon deposition. A layer of silicon is deposited on the carrier body.

After the deposition, the carrier body is allowed to cool to room temperature, the apparatus is opened, and the semiconductor product is removed.

Optionally, the carrier body is burned away in air at a temperature of from about 500° to 1000° C.

The product semiconductor body has a smooth surface, a dense, non-porous structure, and high mechanical and thermal stability.

After the deposition, the heater body is examined and found to have substantially no silicon deposited thereon and is reused subsequently without intermediate processing.

Other and further embodiments, modifications and variations will be apparent to those skilled in the art from the present specification and drawings and no undue limitations are to drawn therefrom.

We claim:

1. In a method for selectively controlling the physical characteristics of hollow members of semiconductor material, in the production of hollow members of silicon with walls of nonuniform thickness, in which a hollow carrier member, or graphite, on which the hollow member is to be formed, is heated by radiation from a heating element, of graphite, disposed in the interior of the hollow carrier member with the heating element having an external surface disposed in spaced relation with respect to the internal surface of the hollow carrier member, and the heating element in turn being heated by the passage of a direct current therethrough, the combination of the steps of
   a. heating said heating element to a temperature at least 200° C. higher than the maximum depositing temperature of the semiconductor material involved,
   b. so selecting the respective parameters of wall thickness of the carrier member and spacing selected opposing portions of the internal surface of the carrier member and the external surface of the heating element at different distances to correspondingly vary the temperatures of the corresponding portions of the external surface of the carrier member, to thereby selectively control the temperatures at the external surface of the carrier member and correspondingly selectively control the physical characteristics and/or configuration of the semiconductor material deposited on the external surface of the carrier member,
   c. supplying gaseous semiconductor material compound, in the presence of hydrogen, to the carrier member, with decomposition and deposition on the external carrier wall taking place in dependence upon the parameter selection, and
   d. removing the carrier member from the hollow member so formed by heating in an oxygen-rich atmosphere.

2. In a method for selectively controlling the physical characteristics of hollow members of semiconductor material, in the production of hollow members of silicon with walls of nonuniform thickness, in which a hollow carrier member, of graphite, on which the hollow member is to be formed, is heated by radiation from a heating element, of graphite, disposed in the interior of the hollow carrier member, with the heating element having an external surface disposed in spaced relation with respect to the internal surface of the hollow carrier member, and the heating element in turn being heated by the passage of a direct current therethrough, the combination of the steps of
   a. heating said heating element to a temperature at least 200° C higher than the maximum depositing temperature of the semiconductor material involved,
   b. so selecting the respective parameters of wall thickness of the carrier member, whereby the wall thickness of a selected portion thereof is of greater thickness than another thereof, and the spacing between opposing wall surfaces of the heating element and the carrier member, to thereby selectively control the temperatures at the external surface of the carrier member and correspondingly selectively control the physical characteristics and configuration of the semiconductor material deposited on the external surface of the carrier member,
   c. supplying gaseous semiconductor material compound, in the presence of hydrogen, to the carrier member, with decomposition and deposition on the external carrier wall taking place in dependence upon the parameter selection, and
   d. removing the carrier member from the hollow member so formed by heating in an oxygen-rich atmosphere.

3. A method according to claim 2, comprising providing areas on the wall of said hollow carrier member in the form of the openings therein, i.e., wall thickness of zero, whereby the hollow member will be formed with corresponding openings therein.

* * * * *